US005900758A

United States Patent [19]

Kanno

[11] Patent Number: 5,900,758

[45] Date of Patent: May 4, 1999

[54] DYNAMIC CIRCUIT FOR HIGH-SPEED OPERATION

[75] Inventor: Hiroshi Kanno, Tokyo, Japan

[73] Assignee: NEC Corporation, Tokyo, Japan

[21] Appl. No.: 08/877,088

[22] Filed: Jun. 17, 1997

[30] Foreign Application Priority Data

Jun. 17, 1996 [JP] Japan .................................... 8-155692
Apr. 11, 1997 [JP] Japan .................................... 9-093852

[51] Int. Cl.[6] .......................... H03K 3/356; H03K 17/687

[52] U.S. Cl. .......................... 327/201; 327/211; 327/212; 327/218; 326/28; 326/97

[58] Field of Search .................................... 327/200, 201, 327/208, 209–212, 214, 215, 217, 218; 326/96–98, 28, 27

[56] References Cited

U.S. PATENT DOCUMENTS 5,140,194 8/1992 Okitaka .................................... 326/27
5,459,421 10/1995 Shaw ...................................... 327/203

FOREIGN PATENT DOCUMENTS 2-75219 3/1990 Japan .................................... 327/210
1774472 11/1992 U.S.S.R. ................................ 327/218
1 483 068 8/1977 United Kingdom .

OTHER PUBLICATIONS

J. Yuan et al., "High–Speed CMOS Circuit Technique", IEEE Journal of Solid–State Circuits, vol. 24 No. 1, Feb. (1989), pp. 62–70.

*Primary Examiner*—Tuan T. Lam
*Attorney, Agent, or Firm*—Foley & Lardner

[57] ABSTRACT

A dynamic latch circuit or a dynamic flip-flop circuit of the present invention includes a transfer gate to be controlled by a clock and provided with a complementary configuration using a P-channel and an N-channel MOS (Metal Oxide Semiconductor) transistor. The transfer gate allows the individual node included in the circuit to fully swing between a high potential power source and a low potential power source. This causes a minimum of decrease to occur in an ON current for driving the respective node and thereby realizes high-speed operation. Further, the balance of the rising time and falling time of an output signal is improved, reducing the deviation of the duty of the output signal from 50%. The circuit is therefore operable with sufficient operation margins at positive- and negative-going edges. Consequently, the entire macrocircuit using the circuit of the present invention can have its operation frequency and therefore power consumption lowered.

2 Claims, 12 Drawing Sheets

SETB DATA CLKB CLK SET VDD GND QB P1 P2 P3 P4 P5 P7 P8 N1 N2 N3 N4 N5 N6 N9 001 002 003 004 005

VDD
QB
GND
P1
P2
P3
P4
P5
N1
N2
N3
N4
N5
001
002
003
004
DATA
CLKB
CLK

VDD
QB
GND
P5
N5
N9
P3
003
N4
004
N3
P4
P8
P7
001
N2
002
N1
005
P1
P2
N6
SETB
DATA
CLKB
CLK
SET

VDD
QB
GND
P5
N5
P9
P3
003
N4
004
N3
P4
001
N8
002
006
P6
P1
N2
P2
N1
N7
RSTB
DATA
CLKB
CLK
RST

DYNAMIC CIRCUIT FOR HIGH-SPEED OPERATION

BACKGROUND OF THE INVENTION

The present invention relates to a dynamic circuit for high-speed operation and, more particularly, to a dynamic flip-flop circuit and a dynamic latch circuit operable at a high speed while consuming a minimum of power.

A dynamic circuit of the kind described is used in the high-speed circuits art using a CMOS (complementary Metal Oxide Semiconductor) process. Various kinds of dynamic latch circuits and dynamic flop-flop circuits operable at high speeds are taught in "High-Speed CMOS Circuit Technique", IEEE Journal of Solid-State Circuits, Vol. 24, No. 1, February, 1989, pp. 62–70. However, the circuits taught in this document each has a problem that the rise time and fall time of its output signal are not balanced and cause the duty cycle to deviate from 50%, degrading the balance of circuit operation.

SUMMARY OF THE INVENTION

It is therefore an object of the present invention to provide a dynamic latch circuit and a dynamic flip-flop circuit capable of improving the balance of the rise time and fall time of an output signal so as to reduce the deviation of the duty cycle from 50%, and operable at a high speed with a minimum of power.

In accordance with the present invention, a dynamic latch circuit of the present invention includes a data terminal, a first control terminal, a second control terminal for receiving a control signal opposite in phase to a control signal input to the first control terminal, and an output terminal. A MOS transistor of first conduction type has a source connected to a first power source, a drain connected to a first node, and a gate connected to the data terminal. A MOS transistor of second conduction type has a source connected to a second power source, a drain connected to a second node, and a gate connected the data terminal. A MOS transistor of first conduction type has a source connected to the first node, a drain connected to the second node, and a gate connected to the first control terminal. A MOS transistor of second conduction type has a source connected to the second node, a drain connected to the first node, and a gate connected to the second control terminal. A MOS transistor of first conduction type has a source connected to the first power source, a drain connected to the output terminal, and a gate connected to the first node. A MOS transistor of second conduction type has a source connected to the second power source, a drain connected to the output terminal, and a gate connected to the second node.

Also, in accordance with the present invention, a dynamic flip-flop circuit of the present invention includes a data terminal, a first control terminal, a second control terminal for receiving a control signal opposite in phase to a control signal input to the first control signal, and an output terminal. A MOS transistor of first conduction type has a source connected to a first power source, a drain connected to a first node, and a gate connected to the data terminal. A MOS transistor of second conduction type has a source connected to a second power source, a drain connected to a second node, and a gate connected to the data terminal. A MOS transistor of first conduction type has a source connected to the first node, a drain connected to the second node, and a gate connected to the first control terminal. A MOS transistor of second conduction type has a source connected to the second terminal, a drain connected to the first node, and a gate connected to the second control node. A MOS transistor of first conduction type has a source connected to the first power source, a drain connected to a third node, and a gate connected to the first node. A MOS transistor of second conduction type has a source connected to the second power source, a drain connected to a fourth node, and a gate connected to the second node. A MOS transistor of first conduction type has a source connected to the third node, a drain connected to the fourth node, and a gate connected to the second control terminal. A MOS transistor of second conduction type has a source connected to the fourth node, a drain connected to the third node, and a gate connected to the first control terminal. A MOS transistor of first conduction type has a source connected to the first power source, a drain connected to the output terminal, and a gate connected to the third node. A MOS transistor of second conduction has a source connected to the second power source, a drain connected to the output terminal, and a gate connected to the fourth node.

Further, in accordance with the present invention, a dynamic flip-flop circuit having a setting function includes a data terminal, a first control terminal, a second control terminal for receiving a control signal opposite in phase to a control signal input to the first control. signal, a third control terminal, a fourth control terminal for receiving a control signal opposite in phase to a control signal input to the third control terminal, and an output terminal. A MOS transistor of first conduction type has a source connected to a first power source, a drain connected to a first node, and a gate connected to the data terminal. A MOS transistor of second conduction type has a source connected to a second power source, a drain connected to a fifth node, and a gate connected to the fourth control terminal. A MOS transistor of second conduction type has a source connected to the fifth node, a drain connected to a second node, and a gate connected to the data terminal. A MOS transistor of first conduction type has a source connected to the first node, a drain connected to the second node, and a gate connected to the first control terminal. A MOS transistor of second conduction type has a source connected to the second node, a drain connected to the first node, and a gate connected to the second control terminal. A MOS transistor of first conduction type has a source connected to the first power source, a drain connected to a third node, and a gate connected to the first node. A MOS transistor of second conduction type has a source connected to the second power source, a drain connected to a fourth node, and a gate connected to the second node. A MOS transistor of first conduction type has a source connected to the third node, a drain connected to the fourth node, and a gate connected to the second control terminal. A MOS transistor of second conduction type has a source connected to the fourth node, a drain connected to the third node, and a gate connected to the first control terminal. A MOS transistor of first conduction type has a source connected to the first power source, a drain connected to the output terminal, and a gate connected to the third node. A MOS transistor of second conduction type has a source connected to the second power source, a drain connected to the output terminal, and a gate connected to the fourth node. A MOS transistor of second conduction type has a source connected to the second power source, a drain connected to the third node, and a gate connected to the third control terminal. A MOS transistor of first conduction type has a source connected to the first power source, a drain connected to the first node, and a gate connected to the fourth control terminal. A MOS transistor of first conduction type has a source connected to the first power source, a drain connected to the second node, and a gate connected to the fourth control terminal.

Moreover, in accordance with the present invention, a dynamic flip-flop circuit having a resetting function includes a data terminal, a first control terminal, a second control terminal for receiving a control signal opposite in phase to a control signal input to the first control signal, a third control terminal, a fourth control terminal for receiving a control signal opposite in phase to a control signal input to the third control terminal, and an output terminal. A MOS transistor of first conduction type has a source connected to a first power source, a drain connected to a fifth node, and a gate connected to the third control terminal. A MOS transistor of first conduction type has a source connected to the fifth node, a drain connected to a first node, and a gate connected to the data terminal. A MOS transistor of second conduction type has a source connected to a second power source, a drain connected to a second node, and a gate connected to the data terminal. A MOS transistor of first conduction type has a source connected to the first node, a drain connected to the second node, and a gate connected to the first control terminal. A MOS transistor of second conduction type has a source connected to the second node, a drain connected to the first node, and a gate connected to the second control terminal. A MOS transistor of first conduction type has a source connected to the first power source, a drain connected to a third node, and a gate connected to the first node. A MOS transistor of second conduction type has a source connected the second power source, a drain connected to a fourth node, and a gate connected to the second node. A MOS transistor of first conduction type has a source connected to the third node, a drain connected to the fourth node, and a gate connected to the second control terminal. A MOS transistor of second conduction type has a source connected to the fourth node, a drain connected to the third node, and a gate connected to the first control terminal. A MOS transistor of first conduction type has a source connected to the first power source, a drain connected to the output terminal, and a gate connected to the third node. A MOS transistor of second conduction type has a source connected to the second power source, a drain connected to the output terminal, and a gate connected to the fourth node. A MOS transistor of first conduction type has a source connected to the first power source, a drain connected to the fourth node, and a gate connected to the fourth control terminal. A MOS transistor of second conduction type has a source connected to the second power source, a drain connected to the first node, and a gate connected to the third control terminal. A MOS transistor of second conduction type has a source connected to the second power source, a drain connected to the second node, and a gate connected to the third control terminal.

In addition, in accordance with the present invention, a dynamic flip-flop circuit includes a data terminal, a first control terminal, a second control terminal for receiving a control signal opposite in phase to a control signal input to the first control terminal, and an output terminal. A MOS transistor of first conduction type has a source connected to the data terminal, a drain connected to a first node, and a gate connected to the first control terminal. A MOS transistor of second conduction type has a source connected to the data terminal, a drain connected to the first node, and a gate connected to the second control terminal. A MOS transistor of first conduction type has a source connected to a first power source, a drain connected to a second node, and a gate connected to the first node. A MOS transistor of second conduction type has a source connected to a second power source, a drain connected to a third node, and a gate connected to the first node. A MOS transistor of first conduction type has a source connected to the second node, a drain connected to the third node, and a gate connected to the second control terminal. A MOS transistor of second conduction type has a source connected to the third node, a drain connected to the second nodes and a gate connected to the first control terminal. A MOS transistor of first conduction type has a source connected to the first power source, a drain connected to the output terminal, and a gate connected to the second node. A MOS transistor of second conduction type has a source connected to the second power source, a drain connected to the output terminal, and a gate connected to the third node.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
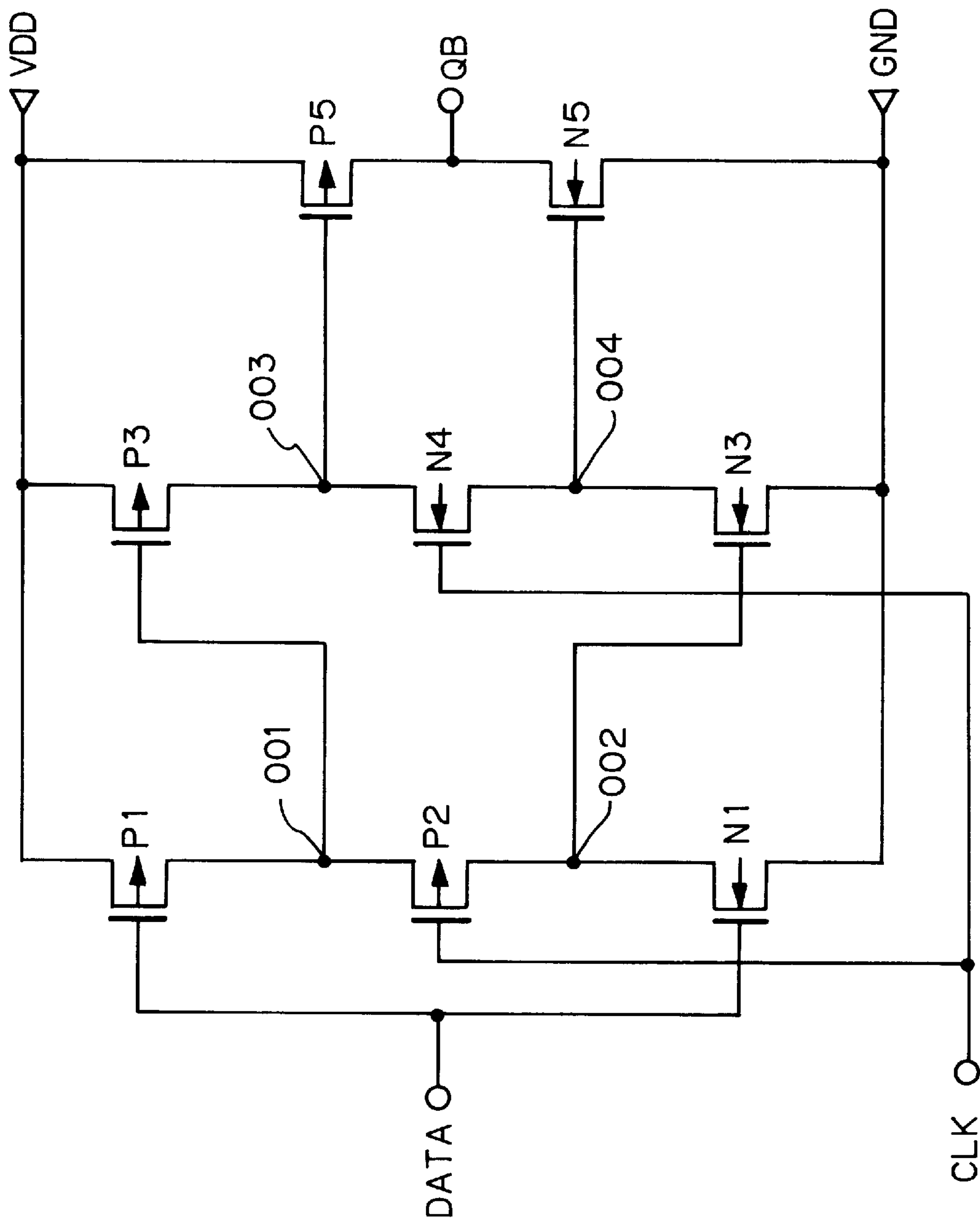
FIG. 1 is a circuit diagram showing a conventional dynamic flip-flop circuit.

To better understand the present invention, brief reference will be made to a flip-flop circuit taught in the previously mentioned document, shown in FIG. 1. As shown, the flip-flop circuit includes a P-channel transistor P1 having a source connected to a high potential power source VDD, a drain connected to a node 001, and a gate connected to data DATA. A P-channel MOS transistor P2 has a source connected to the node 001, a drain connected to a node 002, and a gate connected to a positive-phase clock CLK. An N-channel MOS transistor N1 has a source connected to a low potential power source GND, a drain connected to the node 002, and a gate connected to the data DATA. A P-channel MOS transistor P3 has a source connected to the power source VDD, a drain connected to a node 003, and a gate connected to the node 001. An N-channel MOS transistor N4 has a source connected to a node 004, a drain connected to the node 003, and a gate connected to the positive-phase clock CLK. An N-channel MOS transistor N3 has a source connected to the power source GND, a drain connected to the node 004, and a gate connected to the node 002. A P-channel MOS transistor P5 has a source connected to the power source VDD, a drain connected to an output QB, and a gate connected to the node 003. An N-channel MOS transistor N5 has a source connected to the power source GND, a drain connected to the output QB, and a gate connected to the node 004.

The above flip-flop circuit operates as follows. Let a signal level substantially equal to the potential of the power source VDD and a signal level substantially equal to the potential of the power source GND be H (high) and L (low), respectively.

Assume that the signal applied to the data DATA is L while L is applied to the positive-phase clock CLK. Then, the transistors P1 and P2 turn on while the transistor N1 turns off. As a result, both the nodes 001 and 002 go H. Therefore, the transistor P3 turns off, the transistor N3 turns on, and the transistor N4 turns off. This causes the node 004 to go L and causes the transistor NS to turn off. At this instant, the node 003 is a dynamic node and holds the previous status, so that the value on the output QB is determined by the status of the node 003, i.e., the previous status of the circuit. On the transition of the positive-phase clock CLK to H, the transistor P2 turns off while the MOS transistor N4 turns on. Consequently, the node 002 turns out a dynamic node holding H while the node 003 goes L. Therefore, the transistor P5 turns on and causes H of the negation value of the data DATA to appear on the output QB.

Next, assume that the signal applied to the data DATA is H while L is applied to the positive-phase clock CLK. Then, the transistor P1 turns off while the transistor P2 and N1 turn on, causing both the nodes 001 and 002 to go L. In response, the transistor P3 turns on while the transistors N3 and N4 turn off. Consequently, the node 003 goes H and cause the transistor P5 to turn off. At this instant, the node 004 is a dynamic node and holds the previous status, so that the value on the output QB is determined by the status of the node 004, i.e., the previous state of the circuit. On the transition of the positive-phase clock CLK to H, the transistor P2 turns off while the transistor N4 turns on. As a result, the node 001 becomes a dynamic node holding L while the node 004 goes H. Therefore, the transistor N5 turns on, causing L of the negation value of the data DATA to appear on the output QB.

Figure 2:
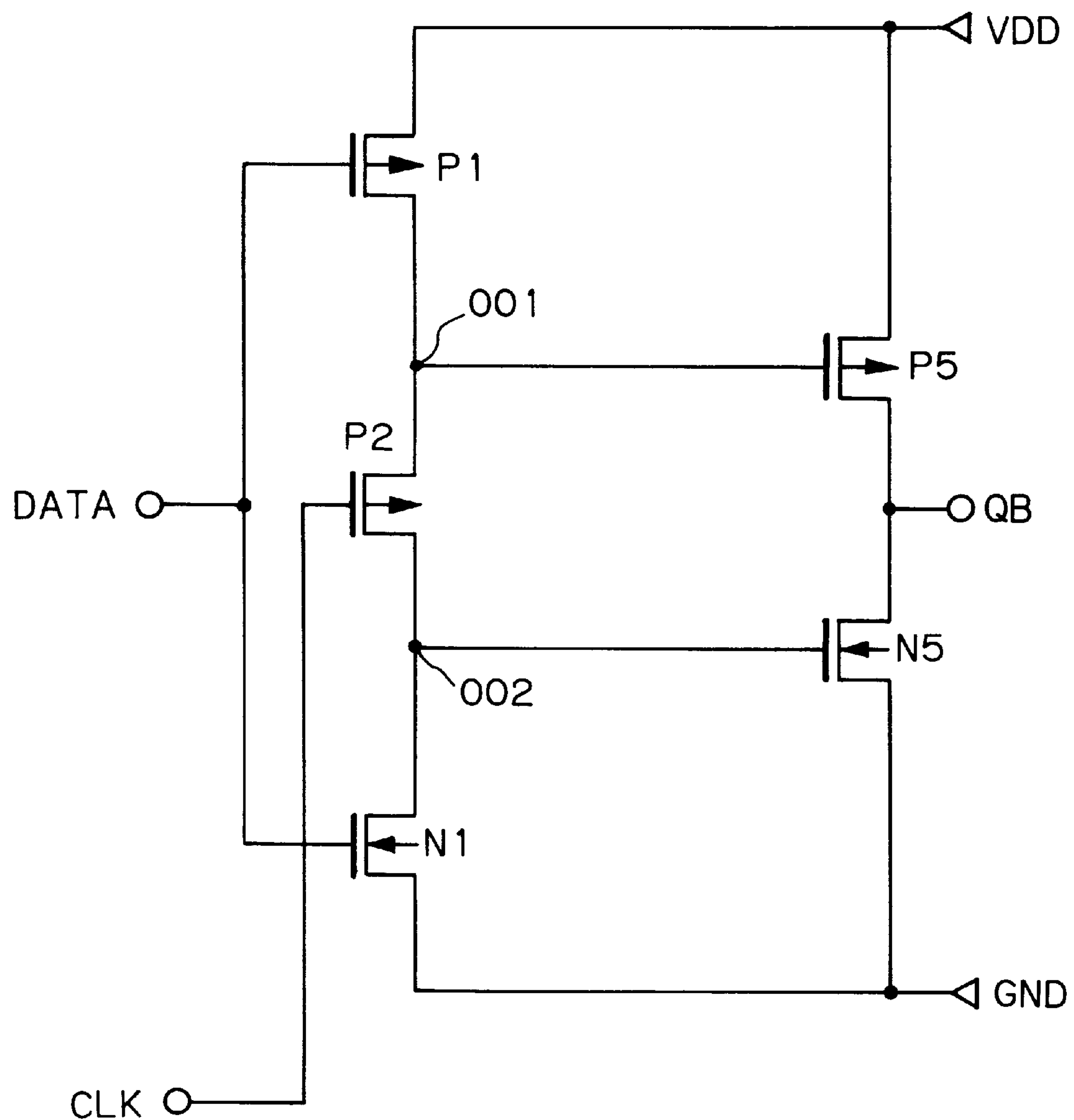
FIG. 2 is a circuit diagram showing a conventional dynamic latch circuit.

FIG. 2 shows a dynamic latch circuit also taught in the document mentioned earlier. As shown, the dynamic latch circuit includes a P-channel MOS transistor P1 having a source connected to a high potential power source VDD, a drain connected to a node 001, and a gate connected to data DATA. An N-channel MOS transistor N1 has a source connected to a low potential power source GND, a drain connected to a node 002, and a gate connected to the data DATA. A P-channel MOS transistor P2 has a source connected to the node 001, a drain connected to the node 002, and a gate connected to a positive-phase clock CLK. A P-channel MOS transistor P5 has a source connected to the power source VDD, a drain connected to an output QB, and a gate connected to the node 001. An N-channel MOS transistor N5 has a source connected to the power source GND, a drain connected to the output QB, and a gate connected to the node 002.

In operation, when both the data DATA and positive-phase clock CLK shown in FIG. 2 are L, the transistors P1 and P2 turn on while the transistor N1 turns off, causing both the nodes 001 and 002 to go H. In response, the transistor P5 turns off while the transistor N5 turns on, causing the output QB to go L. On the transition of the clock CLK to H, the MOS transistor P2 turns off with the result that the node 002 becomes a dynamic node. On the other hand, when the data DATA and clock CLK are respectively H and L, the transistor P1 turns off while the transistors P2 and N1 turn on, causing the nodes 001 and 002 to go L. In response, the transistor PS turns on while the transistor N5 turns off, causing H to appear on the output QB. On the transition of the clock CLK to H, the transistor P2 turns off with the result that the node 001 turns out a dynamic node.

Figure 3:
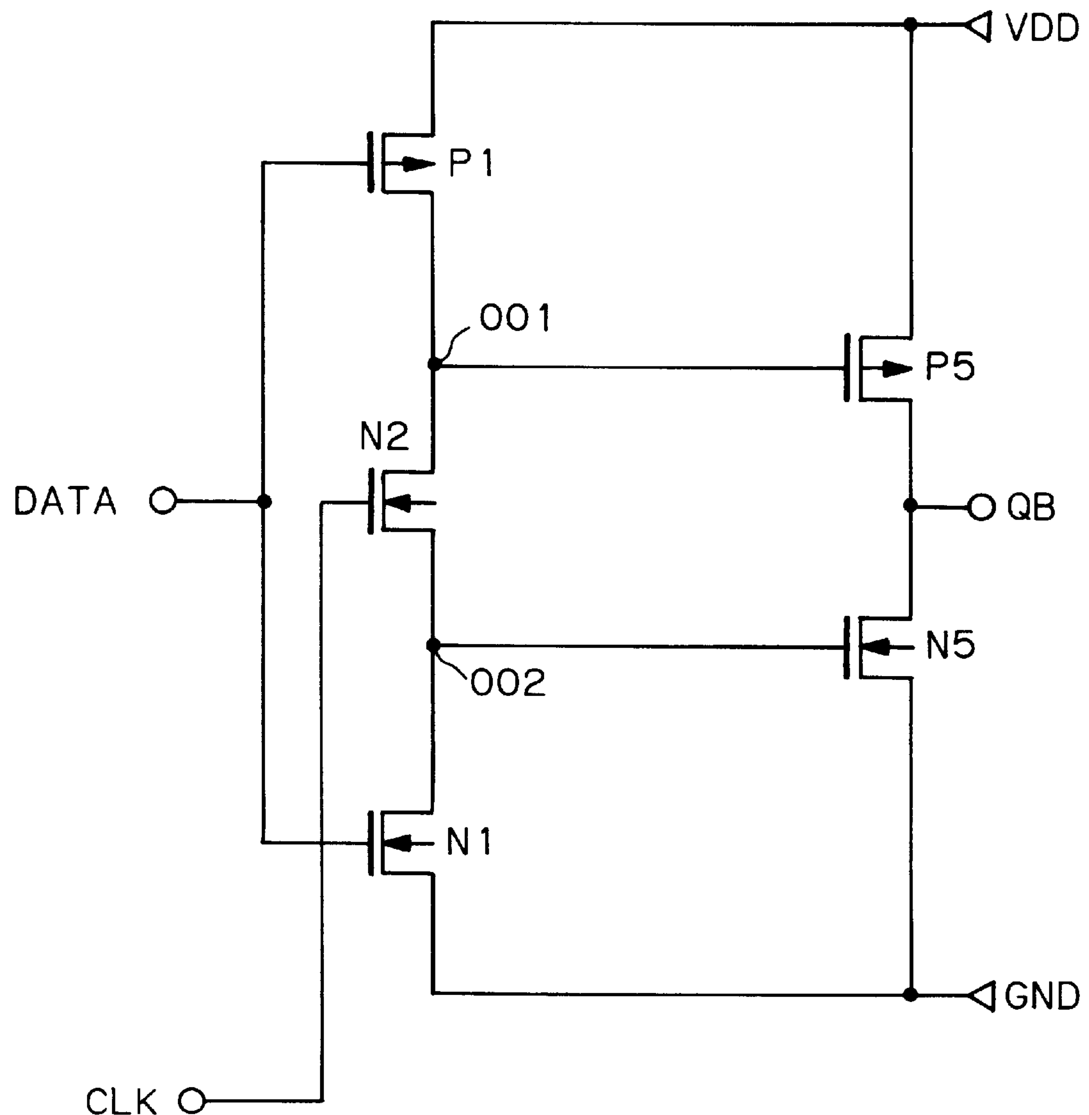
FIG. 3 is a circuit diagram showing another conventional dynamic latch circuit.

FIG. 3 shows another dynamic latch circuit disclosed in the same document. As shown, the latch circuit includes a P-channel MOS transistor P1 having a source connected to a high potential power source VDD, a drain connected to a node 001, and a gate connected to the data DATA. An N-channel MOS transistor N1 has a source connected to a low potential power source GND, a drain connected to a node 002, and a gate connected to the data DATA. An N-channel MOS transistor N2 has a source connected to the node 002, a drain connected to the node 001, and a gate connected to a positive-phase clock CLK. A P-channel MOS transistor P5 has a source connected to the power source VDD, a drain connected to an output QB, and a gate connected to the node 001. An N-channel MOS transistor N5 has a source connected to the power source GND, a drain connected to the output QB, and a gate connected to the node 002.

The operation of the latch circuit shown in FIG. 3 is as follows. Assume that the data DATA and positive-phase clock are L and H, respectively. Then, the transistors P1 and N2 turn on while the transistor N1 turns off, causing the nodes 001 and 002 to go H. Consequently, the transistor P5 turns off while the transistor N5 turns on, causing the output QB to go L. On the transition of the clock CLK to L, the transistor N2 turns off with the result that the node 002 becomes a dynamic node. On the other hand, when both the data DATA and clock CLK are H, the transistor P1 turns off while the transistors N2 and N1 turn on, causing the nodes 001 and 002 to go L. As a result, the transistor P5 turns on while the transistor N5 turns off, causing the output QB to go H. On the transition of the clock CLK to L, the transistor N2 turns off, causing the node 001 to become a dynamic node.

Figure 4:
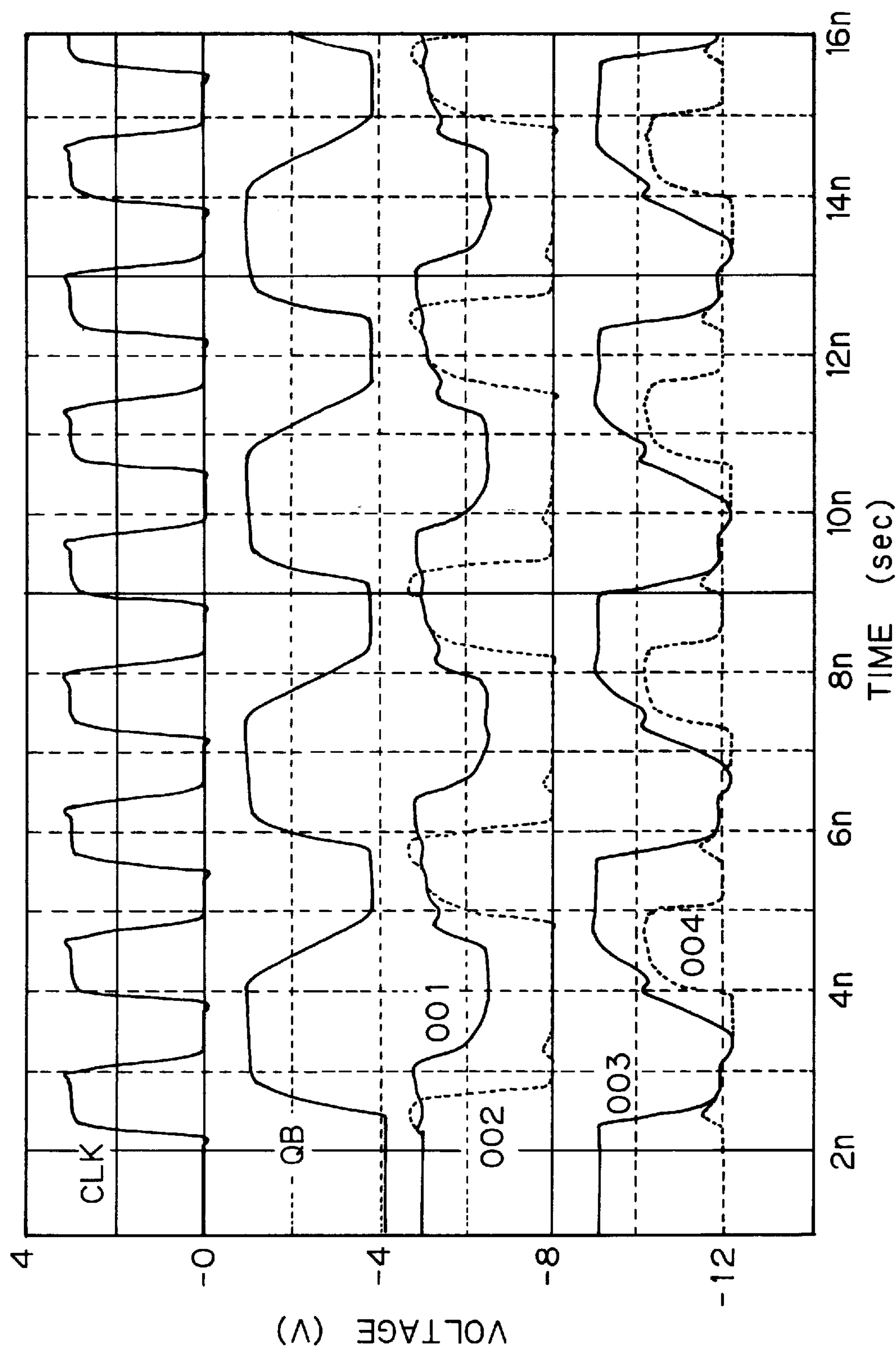
FIG. 4 shows waveforms representative of the frequency dividing operation particular to the circuit of FIG. 1.

FIG. 4 shows waveforms representative of the frequency dividing operation of the circuit shown in FIG. 1 and determined by simulation. For the simulation, a 0.5 $\mu$m CMOS process was used. The power sources VDD and GND were respectively selected to be 3 V and 0 V. The P-channel MOS transistors and N-channel MOS transistors had a gate width of 8 $\mu$m and a gate width of 4 $\mu$m, respectively. The output QB was connected to the data DATA. A signal having a frequency of 600 MHz was applied to the positive-phase clock CLK. In FIG. 4, the potentials of the clock CLK, output QB and nodes 001–004 each is shown with an offset for easy understanding.

As shown in FIG. 4, when the clock CLK transits between L and H, a longer period of time is necessary for the output QB to change from H to L than for the same to change from L to H. As a result, the ratio of the high level signal to one period, i.e., a duty is more than 50%. To reduce the power consumption of a high-speed circuit, processing may be executed at the positive-and negative-going edges of a clock so as to lower the operation frequency of the entire macro-circuit implemented by a flip-flop circuit. In such a case, the duty should preferably be 50% in order to guarantee design margins. Moreover, because the L potential is not fully coincident with the potential of the low potential power source GND, a wasteful leak current flows through a transistor which receives the output signal. This is not desirable from the power saving standpoint.

More specifically, as shown in FIG. 4, the potentials at the nodes 001 and 004 each includes portions not settling at either the potential of the power source VDD or that of the power source GND, but having intermediate values, even at the time other than the time of transition. This is because when the data DATA and clock CLK are respectively H and L, the node 001 is discharged to L via the P-channel MOS transistor P2 with the result that the potential rises above the potential of the power source GND by the ON voltage (VT) of the MOS. In this case, the potential of the node 001, i.e., the source of the transistor P2 has lowered below the potential of the power source VDD, so that the above potential rises above the potential of the power source GND by more than the usual VT due to the body effect. While the ON current of the the MOS is proportional to the square of the amplitude, the ON current of the P channel MOS transistor P3 to be driven by the node 001 decreases due to the rise of the L level of the node 001, lowering the operating speed. Further, on the transition of the clock CLK to H, the node 004 is charged to H. However, because the charge occurs by way of the N-channel MOS transistor N4, the potential drops below the potential of the power source VDD by VT. This VT also appears to be greater due to the body effect and lowers the ON current of the N-channel MOS transistor 5. As a result, a period of time necessary for the output QB to fall increases, causing the duty to deviate.

In the circuit shown in FIG. 2, when the data DATA and positive-phase clock CLK are respectively H and L, the node 001 is discharged to L via the P-channel MOS transistor P2. Therefore, the potential of the node 001 rises above the potential of the power source GND by VT increased due to the body effect. Consequently, the ON current of the P-channel MOS transistor P5 to be driven by the node 001 falls, making the rising time longer than the falling time. This unbalances the operation of the circuit.

Further, in the circuit shown in FIG. 3, when the data DATA and positive-phase clock CLK are respectively L and H, the node 002 is charged to H by way of the N-channel MOS transistor N2. Therefore, the potential of the node 002 drops by VT increased due to the body effect. Consequently, the ON current of the N-channel MOS transistor N5 to be driven by the mode 002 decreases, making the falling time longer than the rising time. This also unbalances the operation of the circuit Referring to FIG. 5, a dynamic flip-flop circuit embodying the present invention will be described. As shown, the dynamic flip-flop circuit includes a P-channel MOS transistor P1 having a source connected to a high potential power source VDD, a drain connected to a node 001, and a gate connected to data DATA (data terminal). A P-channel MOS transistor P2 has a source connected to the node 001, a drain connected to a node 002, and a gate connected to a positive-phase clock CLK (first control terminal). An N-channel MOS transistor N2 has a source connected to the node 002, a drain connected to the node 001, and a gate connected to a negative-phase clock CLKB (second control terminal). An N-channel MOS transistor N1 has a source connected to a low potential power source GND, a drain connected to the node 002, and a gate connected to the data DATA. A P-channel MOS transistor P3 has a source connected to the power source VDD, a drain connected to a node 003, and a gate connected to the node 001. A P-channel MOS transistor P4 has a source connected to the node 003, a drain connected to a node 004, and a gate connected to the negative-phase clock CLKB. An N-channel MOS transistor N4 has a source connected to the node 004, a drain connected to the node 003, and a gate connected to the positive phase clock CLK. An N-channel MOS transistor N3 has a source connected to the power source GND, a drain connected to the node 004, and a gate connected to the node 002. A P-channel MOS transistor P5 has a source connected to the power source VDD, a drain connected to an output QB (output terminal), and a gate connected to the node 003. An N-channel MOS transistor N5 has a source connected to the power source GND, a drain connected to the output QB, and a gate connected to the node 004.

Figure 5:
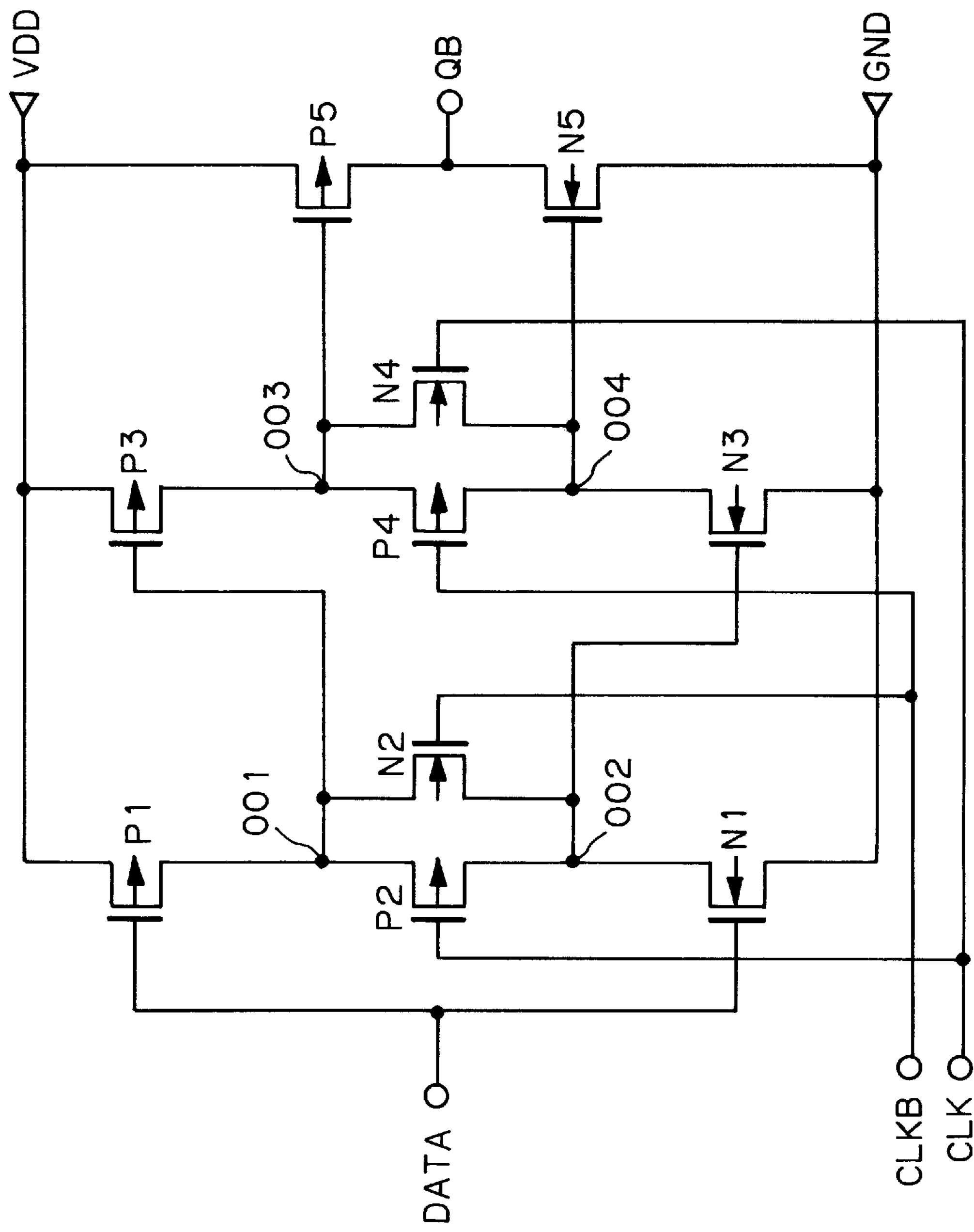
FIG. 5 is a circuit diagram showing a dynamic flip-flop circuit embodying the present invention.

Basically, the circuit shown in FIG. 5 operates in the same manner as the conventional circuit shown in FIG. 1. Specifically, assume that the data DATA is L, and the positive-phase clock CLK and negative-phase clock CLKB are L and H, respectively. Then, the transistors P1 and P2 and the transistor N2 turn on while the transistor N1 turns off, causing both the nodes 001 and 002 to go H. As a result, the transistor P3 turns off, the transistor N3 turns on, and transistors P4 and N4 turn off. The node 004 therefore goes L and causes the transistor N5 to turn off. At this instant, the node 003 is a dynamic node holding the previous status, so that the value of the output QB is determined by the status of the node 003, i.e., the previous status of the circuit. On the transition of the positive-phase clock CLK to H and the transition of the negative-phase clock CLKB to L, the transistors P2 and N2 turn off while the transistors P4 and N4 turn on. Consequently, the node 002 becomes a dynamic node holding H, and the node 003 goes L. This causes the transistor P5 to turn on and thereby causes H of the negation value of the data DATA to appear on the output QB.

Next, assume that the data DATA is H, the positive-phase clock CLK is L, and the negative-phase clock CLKB is H. Then, the transistor P1 turns off while the transistors P2, N1 and N2 turn on, causing both the nodes 001 and 002 to go L. As a result, the transistor P3 turns on, the transistor N3 turns off, and the transistors P4 and N4 turn off, causing the node 003 to go H. Consequently, the transistor P5 turns off. At this instant, the node 004 is a dynamic node holding the previous status, so that the value of the output QB is determined by the status of the node 004, i.e., the previous status of the circuit. On the transition of the clock CLK to H and the transition of the clock CLKB to L, the transistors P2 and N2 turn off while the transistors P4 and N4 turn on with the result that the node 001 turns out a dynamic node holding L. The node 004 goes H and causes the transistor N5 to turn on. Consequently, the negation value L of the data DATA appears on the output QB.

The circuit of FIG. 5 solves the problems discussed with reference to FIG. 1, as follows. Assume that a signal on the data DATA is H, that the positive-phase clock CLK is L, and that the negative-phase clock CLKB is H, causing the node 001 to be discharged to L. Then, the circuit shown in FIG. 1 causes the discharge to occur only via the transistor P2. By contrast, in the circuit shown in FIG. 5, the above discharge occurs not only via the transistor P2 but also via the transistor N2. This successfully prevents the potential from rising above the potential of the power source GND by the ON voltage (VT) of the MOS. It follows that the transistor P3 to be driven by the node 001 is free from a decrease in ON current ascribable to a short drive voltage, realizing high-speed operation.

On the transition of the clock CLK to H and the transition of the clock CLKB to L, the node 004 is charged to H. While the circuit of FIG. 1 causes the charge to occur only via the transistor N4, the circuit of FIG. 5 causes it to occur not only via the transistor N4 but also via the transistor P4. This prevents the potential from dropping below the potential of the power source VDD by VT. Therefore, the transistor N5 to be driven by the node 004 is free from a decrease in ON current ascribable to a short drive voltage. It follows that the rising time of the output QB is reduced, and therefore the duty is improved.

Figure 6:
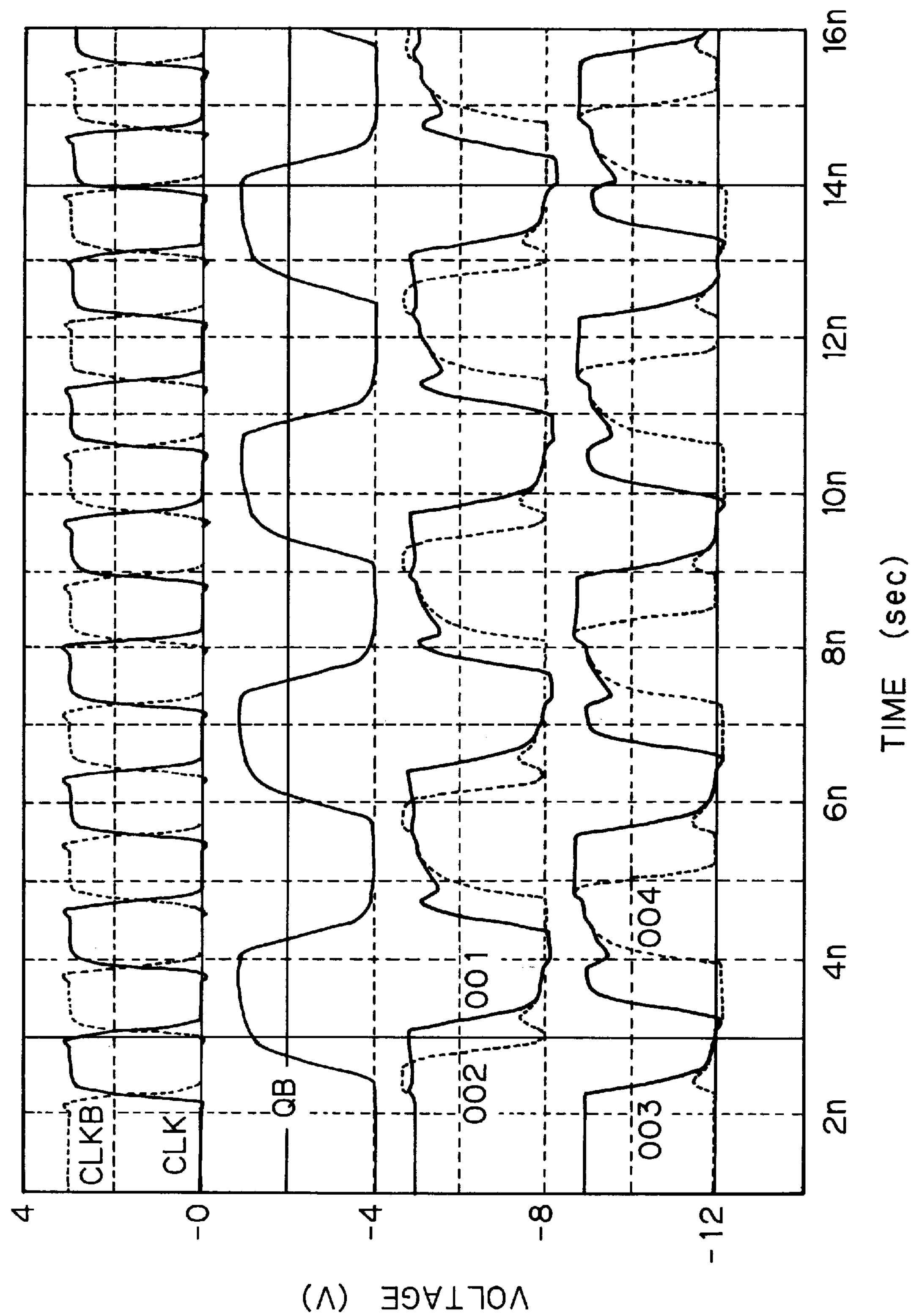
FIG. 6 shows waveforms representative of frequency dividing operation achievable with the embodiment shown in FIG. 5.

FIG. 6 shows waveforms representative of the frequency dividing operation of the circuit shown in FIG. 5 and determined by simulation effected under the same conditions as the simulation of FIG. 4. Again, the potentials of the clocks CLK and CLKB, output QB and nodes 001–004 each is shown with an offset for easy understanding.

In FIG. 4, the potentials at the nodes 001 and 004 each includes portions not settling at either the potential of the power source VDD or that of the power source GND, but having intermediate values, even at the time other than the time of transition, a stated earlier. As FIG. 6 indicates, the circuit of FIG. 5 allows the potentials at the nodes 001 and 004 to fully swing between the two power source potentials, and improves the falling time of the output QB.

Figure 7:
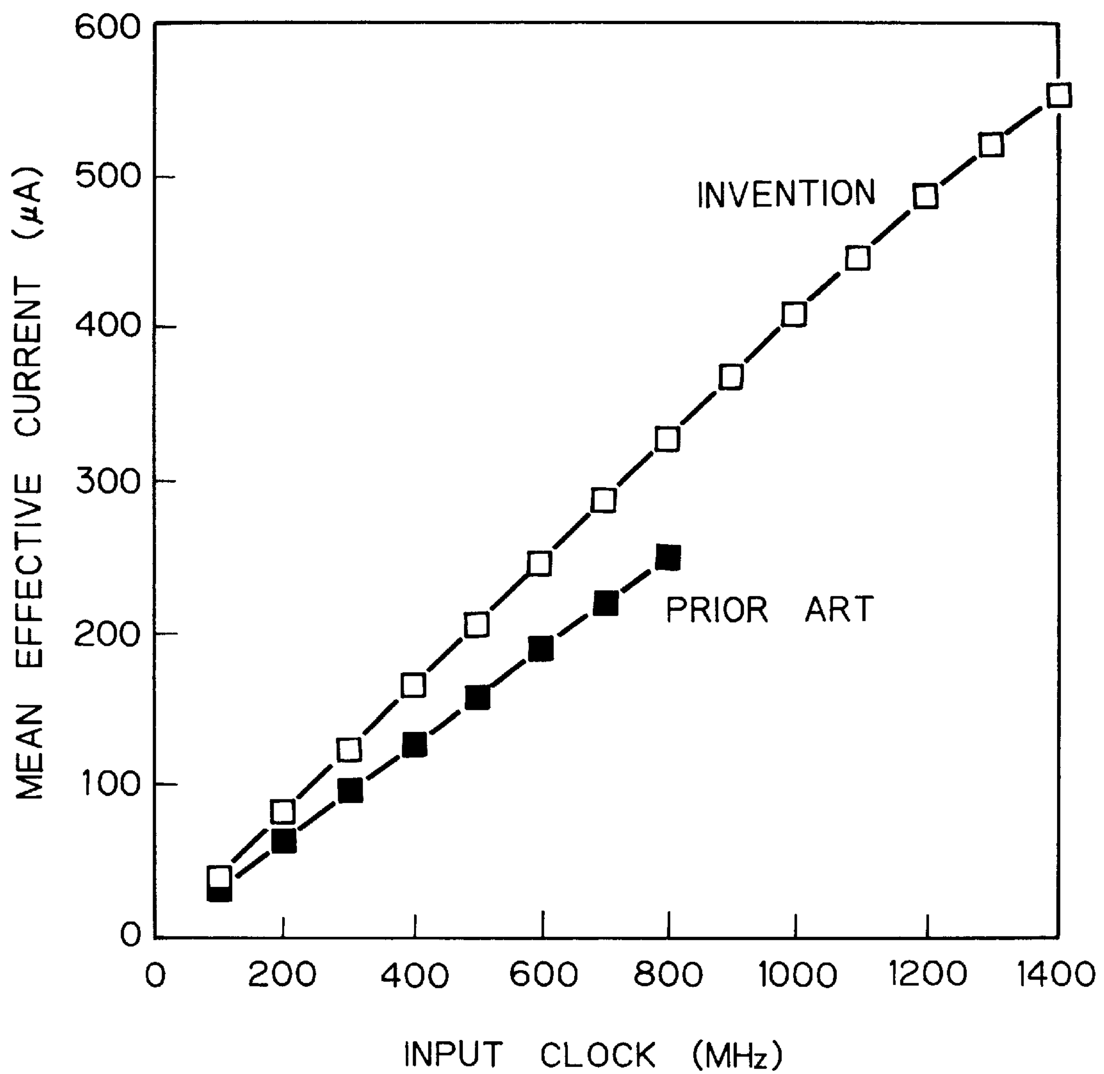
FIG. 7 is graph comparing the circuit of FIG. 1 and that of FIG. 5 with respect to a relation between an input clock and a mean effective current.

The performance of the circuit of FIG. 1 and that of the circuit of FIG. 5 were compared under the same conditions as in the simulations of FIGS. 4 and 6 as to the CMOS process, power sources VDD and GND, and MOS transistor gate widths. The output QB was also connected to the data DATA. The frequency of the input clock was sequentially varied. FIG. 7 plots mean effective currents measured by the simulation. It is to be noted that currents whose amplitudes did not fully swing between the two power source voltages were determined to be not operating and are not plotted in FIG. 7. As shown, although the circuit of FIG. 5 consumes a current slightly more than the circuit of FIG. 1, the former achieves an operating frequency double the operating frequency of the latter, realizing high-speed operation. For a given frequency, the circuit of FIG. 5 allows the gate width to be reduced and thereby reduces current consumption, compared to the circuit of FIG. 1.

Figure 8:
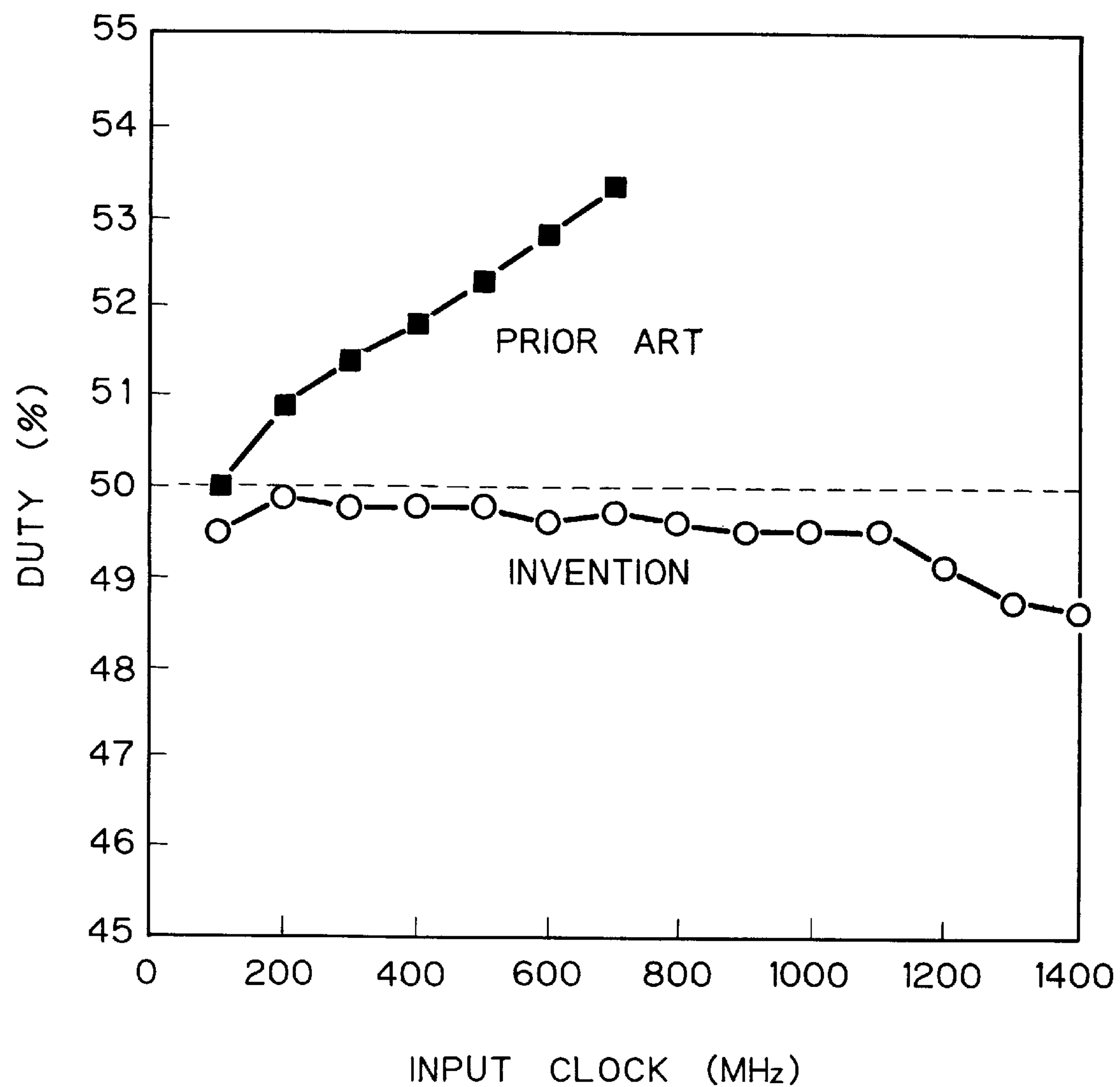
FIG. 8 is a graph comparing the circuit of FIG. 1 and that of FIG. 5 with respect to a relation between an input clock and a duty.

FIG. 8 plots the variation of the duty with respect to the input frequency. As shown, the circuit of FIG. 5 is operable with more stable duties over a broader frequency range than the circuit of FIG. 1. Therefore, with the circuit of FIG. 5, it is possible to insure the stable operation of a high-speed circuit. Moreover, the entire macrocircuit implemented by the circuit of FIG. 5 can have its operation frequency lowered while guaranteeing sufficient design margins. As a result, the power consumption of the entire macrocircuit is reduced.

Figure 9:
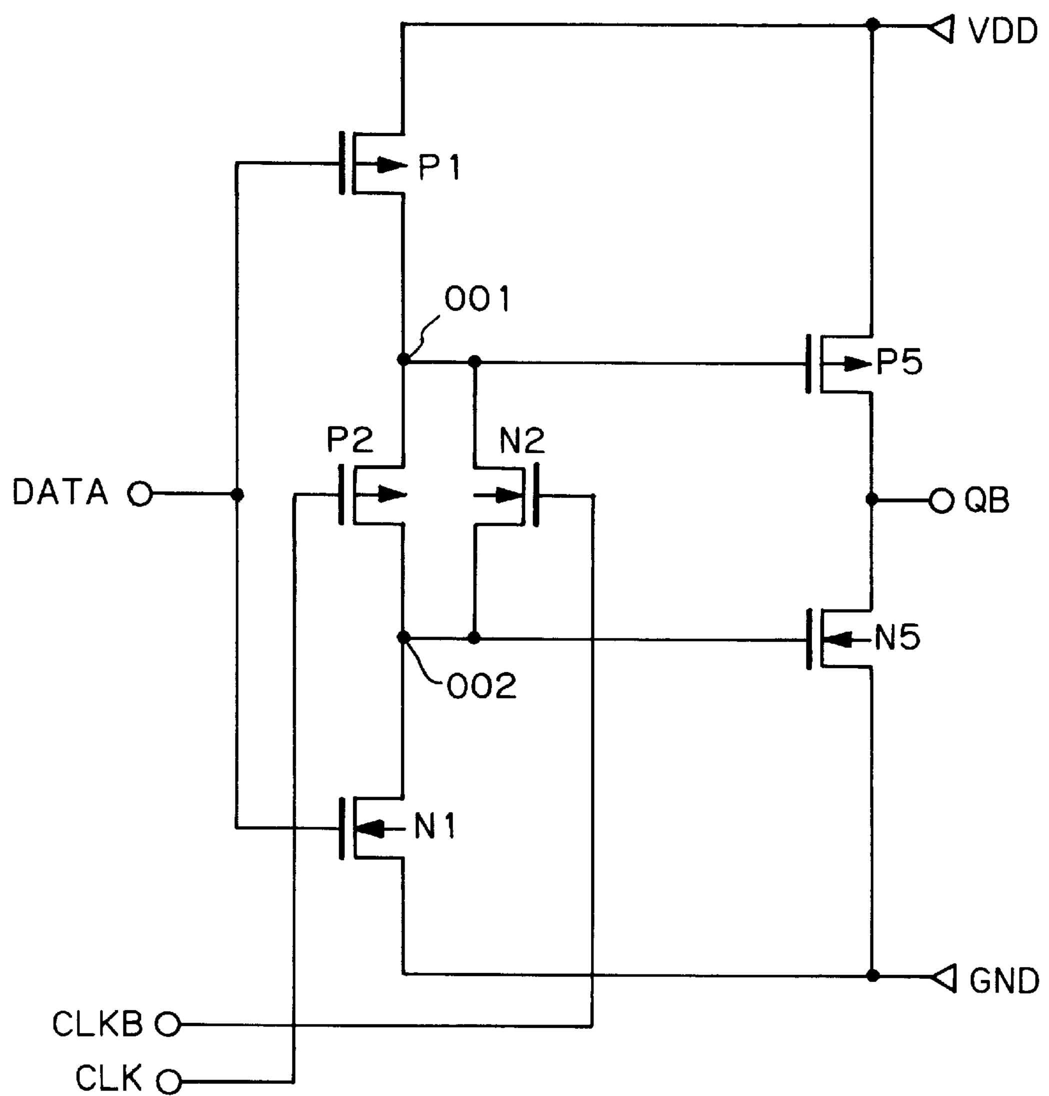
FIG. 9 is a circuit diagram of a dynamic latch circuit representative of an alternative embodiment of the present invention.

Referring to FIG. 9, a dynamic latch circuit representative of an alternative embodiment of the present invention is shown. As shown, the dynamic latch circuit includes a P-channel MOS transistor P1 having a source connected to a high potential power source VDD, a drain connected to a node 001, and a gate connected to data DATA. An N-channel MOS transistor N1 has a source connected to a low potential power source GND, a drain connected to a node 002, and a gate connected to the data DATA. A P-channel MOS transistor P2 has a source connected to the node 001, a drain connected to the node 002, and a gate connected to a positive-phase clock CLK. An N-channel MOS transistor N2 has a source connected to the node 002, a drain connected to the node 001, and a gate connected to a negative-phase clock CLKB. A P-channel MOS transistor P5 has a source connected to a high potential power source VDD, a drain connected to an output QB, and a gate connected to the node 001. An N-channel MOS transistor N5 has a source connected to the power source GND, a drain connected to the output QB, and a gate connected to the node 002.

In the circuit shown in FIG. 9, the nodes 001 and 002 are charged and discharged via a complementary transfer gate constituted by the transistors P2 and N2. Therefore, the potentials on the nodes 001 and 002 are prevented from dropping below the potential of the power source VDD or rising above the potential of the power source GND, so that a decrease in ON current ascribable to a short drive voltage is obviated. It follows that the circuit is capable of operating with a well balanced rise time and a fall time.

Figure 10:
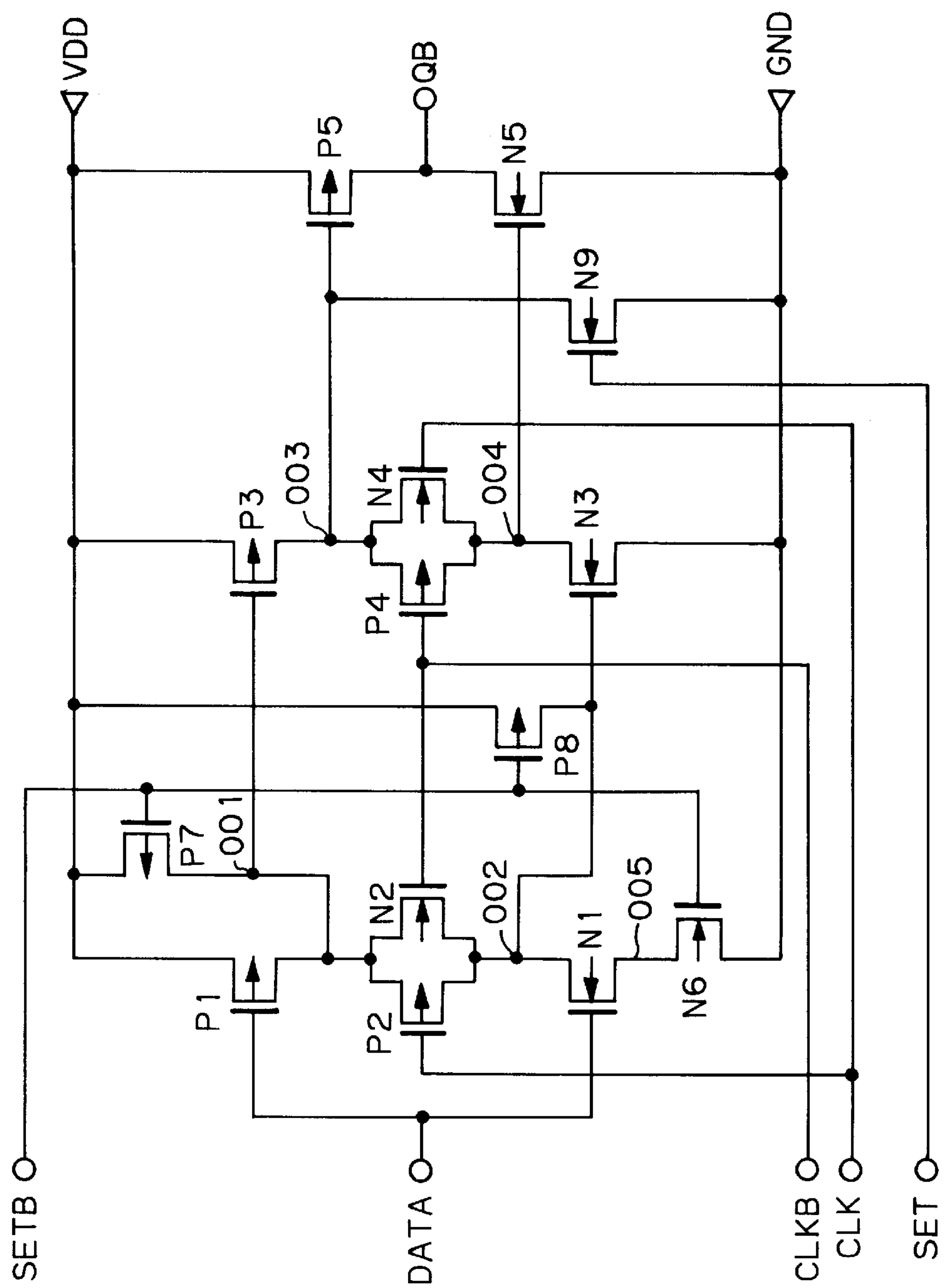
FIG. 10 is a circuit diagram showing a dynamic flip-flop circuit with a setting function and representative of another alternative embodiment of the present invention.

FIG. 10 shows a dynamic flip-flop circuit with a setting function and representative of another alternative embodiment of the present invention. As shown, the flip-flop circuit includes a P-channel MOS transistor P1 having a source connected to a high potential power source VDD, a drain connected to a node 001, and a gate connected to data DATA (data terminal). A P-channel MOS transistor P2 has a source connected to the node 001, a drain connected to a node 002, and a gate connected to a positive-phase clock CLK (first control terminal). An N-channel MOS transistor N6 has a source connected to a low potential power source GND, a drain connected to a node 005, and a gate connected to a negative-phase set signal SETB (fourth control terminal). An N-channel MOS transistor N1 has a source connected to the node 005, a drain connected to the node 002, and a gate connected to the data DATA. An N-channel MOS transistor N2 has a source connected to the node 002, a drain connected to the node 001, and a gate connected to a negative-phase clock CLKB (second control terminal). A P-channel MOS transistor P3 has a source connected to the power source VDD, a drain connected to a node 003, and a gate connected to the node 001. A P-channel MOS transistor P4 has a source connected to the node 003, a drain connected to a source 004, and a gate connected to the negative-phase clock CLKB. An N-channel MOS transistor N3 has a source connected to the the power source GND, a drain connected to the node 004, and a gate connected to the node 002. An N-channel MOS transistor N4 has a source connected to the node 004, a drain connected to the node 003, and a gate connected to the positive-phase clock CLK. A P-channel MOS transistor P5 has a source connected to the power source VDD, a drain connected to a negative-phase output QB (output terminal), and a gate connected to the node 003. An N-channel MOS transistor N5 has a source connected to the power source GND, a drain connected to the output QB, and a gate connected to the node 004. An N-channel MOS transistor N9 has a source connected to the power source GND, a drain connected to the node 003, and a gate connected to a positive-phase set signal SET (third control terminal). A P-channel MOS transistor P7 has a source connected to the power source VDD, a drain connected to the node 001, and a gate connected to the negative-phase set signal SETB. A P-channel MOS transistor P8 has a source connected to the power source VDD, a drain connected to the node 002, and a gate connected to the negative-phase set signal SETB.

In operation, assume that the positive-phase set signal SET and negative-phase set signal SETB are L and H, respectively. Then, the circuit shown in FIG. 10 operates in the same manner as the circuit shown in FIG. 5. Specifically, the circuit charges and discharges its nodes by using a complementary transfer gate implemented by a P-channel and an N-channel MOS transistor. This insures high-speed operation well balanced as to the rise time and fall time of the output signal. When the positive-phase and negative-phase set signals SET and SETB are respectively H and L, the transistors P7, P8 and N9 turn on while the transistor N6 turns off. As a result, the nodes 001 and 002 are charged to H while the nodes 003 and 004 are discharged to L, without regard to the levels of the signals applied to the data DATA and positive-phase and negative-phase clocks CLK and CLKB. Therefore, H appears on the negative-phase output QB.

Figure 11:
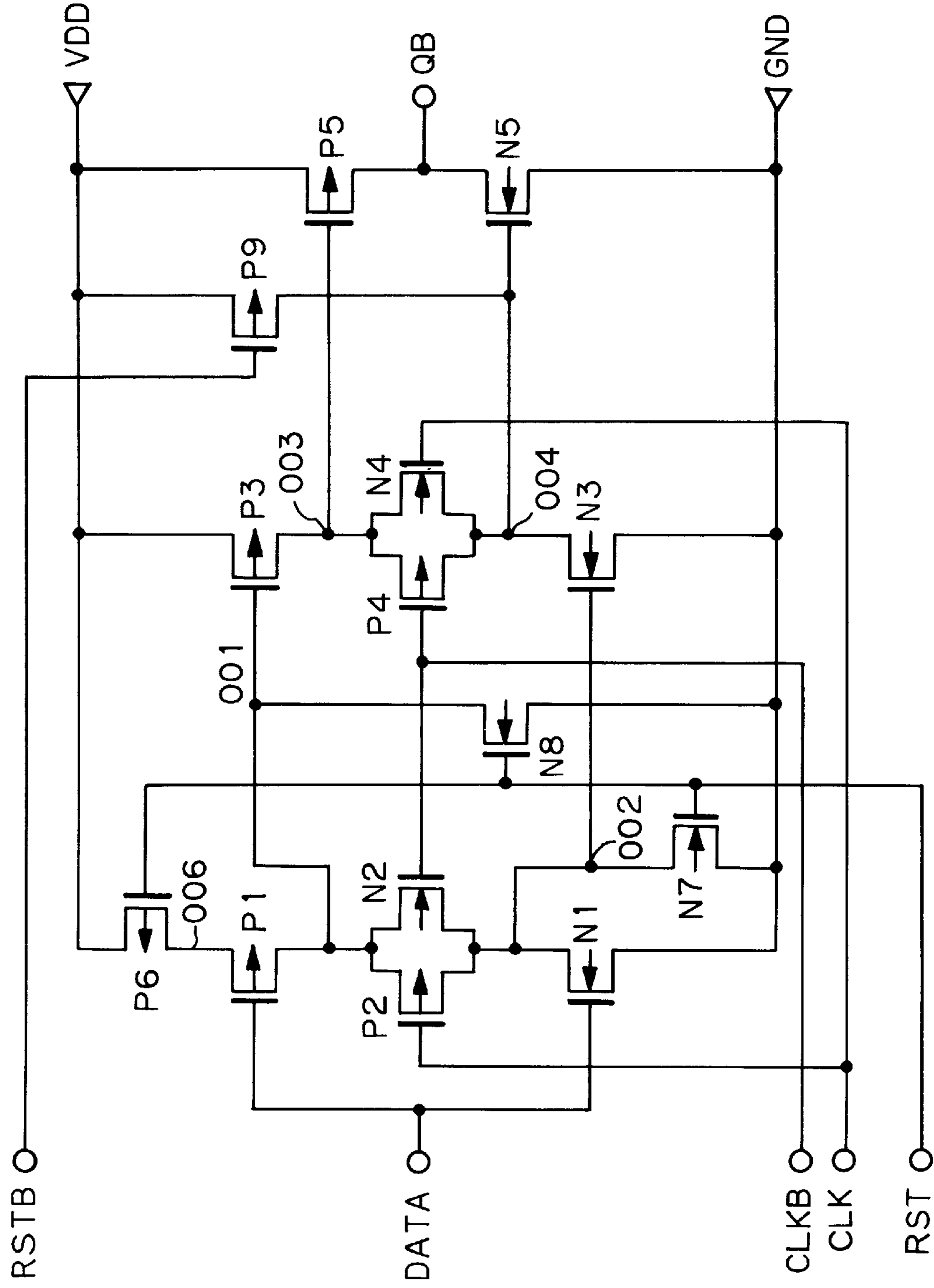
FIG. 11 is a circuit diagram showing a dynamic flip-flop circuit with a resetting function and representative of still another alternative embodiment of the present invention.

FIG. 11 shows a dynamic flip-flop circuit with a resetting function and representative of still another alternative embodiment of the present invention. As shown, the flip-flop circuit includes a P-channel MOS transistor P6 having a source connected to a high potential power source VDD, a drain connected to a node 006, and a gate connected to a positive-phase reset signal RST (third control terminal). A P-channel MOS transistor P1 has a source connected to the node 006, a drain connected to a node 001, and a gate connected to data DATA (data terminal). A P-channel MOS transistor P2 has a source connected to the node 001, a drain connected to a node 002, and a gate connected to a positive-phase clock CLK (first control terminal). An N-channel MOS transistor N1 has a source connected to a low potential power source GND, a drain connected to the node 002, and a gate connected to the data DATA. An N-channel MOS transistor N2 has a source connected to the node 002, a drain connected to the node 001, and a gate connected to a negative-phase clock CLKB (second control terminal). A P-channel MOS transistor P3 has a source connected to the power source VDD, a drain connected to a node 003, and a gate connected to the node 001. A P-channel MOS transistor P4 has a source connected to the node 003, a drain connected to a node 004, and a gate connected to the negative-phase clock CLKB. An N-channel MOS transistor N3 has a source connected to the power source GND, a drain connected to the node 004, and a gate connected to the node 002. An N-channel MOS transistor N4 has a source connected to the node 004, a drain connected to the node 003, and a gate connected to the positive-phase clock CLK. A P-channel MOS transistor P5 has a source connected to the power source VDD, a drain connected to a negative-phase output QB (output terminal), and a gate connected to the node 003. An N-channel MOS transistor N5 has a source connected to the power source GND, a drain connected to the output QB, and a gate connected to the node 004. A P-channel MOS transistor P9 has a source connected to the power source VDD, a drain connected to the node 004, and a gate connected to a negative-phase reset signal RSTB (fourth control terminal). An N-channel MOS transistor N8 has a source connected to the power source GND, a drain connected to the node 001, and a gate connected to the positive-phase reset signal RST. An N-channel MOS transistor N7 has a source connected to the power source GND, a drain connected to the node 002, and a gate connected to the positive-phase reset signal RST.

When the positive-phase and negative-phase reset signals RST and RSTB are respectively L and H, the circuit shown in FIG. 11 operates in the same manner as the circuit shown in FIG. 5. Specifically, the circuit charges and discharges its nodes by using a complementary transfer gate implemented by a P-channel and an N-channel MOS transistor. This insures high-speed operation well balanced as to the rise time and fall time of the output signal. When the positive-phase and negative-phase reset signals RST and RSTB are respectively H and L, the transistors P9, N7 and N8 turn on while the transistor P6 turns off. As a result, the nodes 001 and 002 are discharged to L while the nodes 003 and 004 are charged to H, without regard to the levels of the signals applied to the data DATA and positive-phase and negative-phase clocks CLK and CLKB. Therefore, L appears on the negative-phase output QB.

Figure 12:
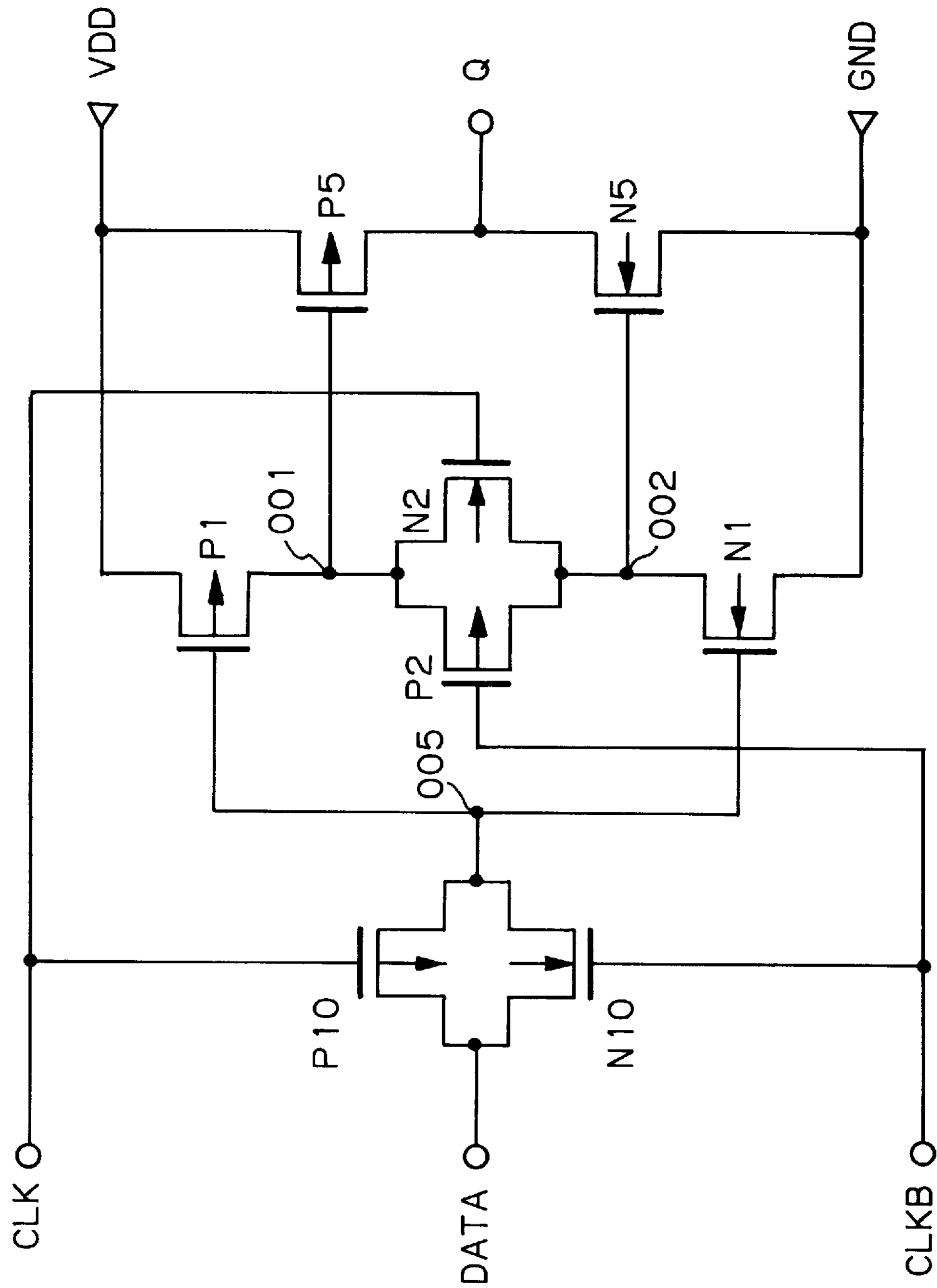
FIG. 12 is a circuit diagram showing a dynamic flip-flop circuit representative of a further alternative embodiment of the present invention.

FIG. 12 shows a dynamic flip-flop circuit representative of a further alternative embodiment of the present invention. As shown, the flip-flop circuit includes a P-channel MOS transistor P10 having a source connected to data DATA (data terminal), a drain connected to a node 005, and a gate connected to a positive-phase clock CLK (first control terminal). An N-channel MOS transistor N10 has a source connected to the data DATA, a drain connected to the node 005, and a gate connected to a negative-phase clock CLKB (second control terminal). A P-channel MOS transistor P1 has a source connected to a high potential power source VDD, a drain connected to a node 001, and a gate connected to the node 005. An N-channel MOS transistor N1 has a source connected to a low potential power source GND, a drain connected to a node 002, and a gate connected to the node 005. A P-channel MOS transistor P2 has a source connected to the node 001, a drain connected to the node 002, and a gate connected to the negative-phase clock CLKB. An N-channel MOS transistor N2 has a source connected to the node 002, a drain connected to the node 001, and a gate connected to the positive-phase clock CLK. A P-channel MOS transistor P5 has a source connected to the power source VDD, a drain connected to a positive-phase output Q (output terminal), and a gate connected to the node 001. An N-channel MOS transistor N5 has a source connected to the power source GND, a drain connected to the positive-phase output Q, and a gate connected to the node 002.

The circuit shown in FIG. 12 operates as follows. Assume that the data DATA is L, and the positive-phase clock CLK and negative-phase clock CLKB are L and H, respectively. Then, the transistors P10 and N10 and discharge the node 005 to L. As a result, the transistor P1 turns on while the transistor N1 turns off. At this instant, the transistors P2 and N2 turn off and charge the node 001 to H. The transistor P5 turns off. The node 002 is a dynamic node holding the previous status, so that the value of the output Q is determined by the status of the node 002, i.e., the previous status of the circuit. On the transition of the positive-phase clock CLK to H and the transition of the negative-phase clock CLKB to L, the transistors P10 and N10 turn off while the transistors P2 and N2 turn on. Consequently, the node 005 becomes a dynamic node holding L, and the node 002 goes H. This causes the transistor N5 to turn on and thereby causes L identical with the value of the data DATA to appear on the output Q.

Next, assume that the data DATA is H, the positive-phase clock CLK is L, and the negative-phase clock CLKB is H. Then, the transistors P10 and N10 turns on and causes the node 005 to go H. As a result, the transistor P1 turns off while the transistor N1 turns on. At this instant, the transistors P2 and N2 turn off, causing the node 002 to go L. The transistor N5 turns off. The node 001 is a dynamic node holding the previous status, so that the value of the output Q is determined by the status of the node 001 i.e., the previous status of the circuit. On the transition of the clock CLK to H and the transition of the clock CLKB to L, the transistors P10 and N10 turn off while the transistors P2 and N2 turn on with the result that the node 002 turns out a dynamic node holding H. The node 001 goes L and causes the transistor P5 to turn on. Consequently, H identical with the value of the data DATA appears on the output Q.

In the above circuit, the nodes are also charged and discharged via a complementary transfer gate constituted by a P-channel and an N-channel MOS transistors. It follows that the circuit is capable of operating at a high speed with a rise time and a fall time well balanced.

In summary, the present invention provides a dynamic latch circuit or a dynamic flip-flop circuit in which a transfer gate controlled by a clock is provided with a complementary configuration using a P-channel and an N-channel MOS transistor. Such a transfer gate allows the individual node included in the circuit to fully swing between a high potential power source and a low potential power source. This causes a minimum of decrease to occur in an ON current for driving the respective node and thereby realizes high-speed operation. Further, the balance of the rise time and fall time of an output signal is improved, reducing the deviation of the duty of the output signal from 50%. The circuit is therefore operable with sufficient operation margins at positive- and negative-going edges. Consequently, the entire macrocircuit using the circuit of the present invention can have its operation frequency and therefore power consumption lowered.

Various modifications will become possible for those skilled in the art after receiving the teachings of the present disclosure without departing from the scope thereof.

What is claimed is:

1. A dynamic flip-flop circuit having a setting function, comprising:

a data terminal;

a first control terminal;

a second control terminal for receiving a control signal opposite in phase to a control signal input to said first control terminal;

a third control terminal;

a fourth control terminal for receiving a control signal opposite in phase to a control signal input to said third control terminal;

an output terminal;

a first MOS transistor of first conduction type having a source connected to a first power source, a drain connected to a first node, and a gate connected to said data terminal;

a first MOS transistor of second conduction type having a source connected to a second power source, a drain connected to a fifth node, and a gate connected to said fourth control terminal;

a second MOS transistor of second conduction type having a source connected to said fifth node, a drain connected to a second node, and a gate connected to said data terminal;

a second MOS transistor of first conduction type having a source connected to said first node, a drain connected to said second node, and a gate connected to said first control terminal;

a third MOS transistor of second conduction type having a source connected to said second node, a drain connected to said first node, and a gate connected to said second control terminal;

a third MOS transistor of first conduction type having a source connected to said first power source, a drain connected to a third node, and a gate connected to said first node;

a fourth MOS transistor of second conduction type having a source connected to said second power source, a drain connected to a fourth node, and a gate connected to said second node;

a fourth MOS transistor of first conduction type having a source connected to said third node, a drain connected to said fourth node, and a gate connected to said second control terminal;

a fifth MOS transistor of second conduction type having a source connected to said fourth node, a drain connected to said third node, and a gate connected to said first control terminal;

a fifth MOS transistor of first conduction type having a source connected to said first power source, a drain connected to said output terminal, and a gate connected to said third node;

a sixth MOS transistor of second conduction type having a source connected to said second power source, a drain connected to said output terminal, and a gate connected to said fourth node;

a seventh MOS transistor of second conduction type having a source connected to said second power source, a drain connected to said third node, and a gate connected to said third control terminal;

a sixth MOS transistor of first conduction type having a source connected to said first power source, a drain connected to said first node, and a gate connected to said fourth control terminal; and a seventh MOS transistor of first conduction type having a source connected to said first power source, a drain connected to said second node, and a gate connected to said fourth control terminal.

2. A dynamic flip-flop circuit having a resetting function, comprising:

a data terminal;

a first control terminal;

a second control terminal for receiving a control signal opposite in phase to a control signal input to said first control terminal;

a third control terminal;

a fourth control terminal for receiving a control signal opposite in phase to a control signal input to said third control terminal;

an output terminal;

a first MOS transistor of first conduction type having a source connected to a first power source, a drain connected to a fifth node, and a gate connected to said third control terminal;

a second MOS transistor of first conduction type having a source connected to said fifth node, a drain connected to a first node, and a gate connected to said data terminal;

a first MOS transistor of second conduction type having a source connected to a second power source, a drain connected to a second node, and a gate connected to said data terminal;

a third MOS transistor of first conduction type having a source connected to said first node, a drain connected to said second node, and a gate connected to said first control terminal;

a second MOS transistor of second conduction type having a source connected to said second node, a drain connected to said first node, and a gate connected to said second control terminal;

a fourth MOS transistor of first conduction type having a source connected to said first power source, a drain connected to a third node, and a gate connected to said first node;

a third MOS transistor of second conduction type having a source connected said second power source, a drain connected to a fourth node, and a gate connected to said second node;

a fifth MOS transistor of first conduction type having a source connected to said third node, a drain connected to said fourth node, and a gate connected to said second control terminal;

a fourth MOS transistor of second conduction type having a source connected to said fourth node, a drain connected to said third node, and a gate connected to said first control terminal;

a sixth MOS transistor of first conduction type having a source connected to said first power source, a drain connected to said output terminal, and a gate connected to said third node;

a fifth MOS transistor of second conduction type having a source connected to said second power source, a drain connected to said output terminal, and a gate connected to said fourth node;

a seventh MOS transistor of first conduction type having a source connected to said first power source, a drain connected to said fourth node, and a gate connected to said fourth control terminal;

a sixth MOS transistor of second conduction type having a source connected to said second power source, a drain connected to said first node, and a gate connected to said third control terminal; and a seventh MOS transistor of second conduction type having a source connected to said second power source, a drain connected to said second node, and a gate connected to said third control terminal.

* * * * *